US00H002193H

(19) United States
(12) Statutory Invention Registration
Lampert et al.
(10) Reg. No.: US H2193 H
(43) Published: Jul. 3, 2007

(54) METHOD OF GROWING HOMOEPITAXIAL SILICON CARBIDE

(75) Inventors: William V. Lampert, Tipp City, OH (US); Christopher J. Eiting, Brandon, FL (US); Scott A. Smith, Keene, NH (US); Trice W. Haas, Dayton, OH (US)

(73) Assignee: The United States of America as represented by the Secretary of the Air Force, Washington, DC (US)

(21) Appl. No.: 10/047,323

(22) Filed: Jan. 14, 2002

Related U.S. Application Data

(60) Provisional application No. 60/265,167, filed on Jan. 30, 2001.

(51) Int. Cl.
*C30B 23/00* (2006.01)

(52) U.S. Cl. ..... 117/108; 117/951

(58) Field of Classification Search ..... 117/84, 117/88, 90, 92, 94, 103, 106, 108, 951
See application file for complete search history.

(56) References Cited

U.S. PATENT DOCUMENTS

| | | | | | |
|---|---|---|---|---|---|
| 3,385,723 | A | * | 5/1968 | Pickar | 427/228 |
| 3,675,619 | A | * | 7/1972 | Burd | 118/719 |
| 3,949,119 | A | * | 4/1976 | Shewchun et al. | 117/106 |
| 5,248,385 | A | * | 9/1993 | Powell | 438/507 |
| 5,288,365 | A | * | 2/1994 | Furukawa et al. | 117/108 |
| 5,354,384 | A | * | 10/1994 | Sneed et al. | 134/6 |
| 5,620,512 | A | * | 4/1997 | Gruen et al. | 117/108 |
| 5,861,346 | A | * | 1/1999 | Hamza et al. | 438/769 |
| 5,915,194 | A | * | 6/1999 | Powell et al. | 438/478 |
| 5,985,356 | A | * | 11/1999 | Schultz et al. | 427/8 |
| 6,110,279 | A | * | 8/2000 | Kito et al. | 117/105 |
| 6,193,797 | B1 | * | 2/2001 | Shiomi et al. | 117/88 |
| 6,270,573 | B1 | * | 8/2001 | Kitabatake et al. | 117/95 |
| 6,273,950 | B1 | * | 8/2001 | Kitabatake | 117/95 |

FOREIGN PATENT DOCUMENTS

JP 62091492 A * 4/1987

OTHER PUBLICATIONS

Kaneda et al. "MBE Growth of 3C SiC/ 6H SiC and the Electric Properties of Its p–n Junction", Journal of Crystal Growth 81(1987) pp. 536–542.*

Patent Abstracts of Japan. English Abstract of JP 62–091492 (1987).*

Fissel et al. "Low temperature growth of SiC Thin Films on Si and 6H–SiC by solid source molecular beam epitaxy" Applied Physics Letters, vol. 66 No. 23, pp. 3182–3184, Jun. 5, 1995, American Institute of Physics.*

Fissel et al. "*Low–temperature growth of SiC thin films on Si and 6H–SiC by solid–source molecular beam epitaxy*" Applied Physics Letters, vol. 66 No. 23, pp. 3182–31844, Jun. 5, 1995, American Institute of Physics.

* cited by examiner

*Primary Examiner*—Dan Pihulic
(74) *Attorney, Agent, or Firm*—Richard A. Lambert; Bobby D. Scearce; Thomas L. Kundert

(57) ABSTRACT

A method of growing a SiC film within an MBE system is disclosed. The method includes charging a first crucible with a quality of $C_{60}$, and coating a second crucible with a layer of SiC. The second crucible is charged with a quantity of solid Si. The crucibles are installed into first and second effusion cells which are placed within the MBE growth chamber. A substrate is prepared by cleaning and polishing and loaded into the MBE growth chamber. The substrate and effusion cells are heated and a layer of SiC is grown by MBE onto the substrate.

2 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OF GROWING HOMOEPITAXIAL SILICON CARBIDE

The present application is related to and claims priority on our prior now abandoned provisional Application No. 60/265,167, filed Jan. 30, 2001, entitled Method of Growing Epitaxial Silicon Carbide.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to Molecular Bearn Epitaxy (MBE) and more specifically to a method of growing homoepitaxial silicon carbide (SiC) using MBE.

The physical and electronic properties of SIC make it a desirable candidate semiconductor material for many applications. Because of its large thermal conductivity, breakdown voltage, and electron saturation velocity, SiC is ideal for the fabrication of devices such as high frequency power devices, solid state phased array radar systems and high frequency power supplies, as well as high power devices such as power electronics for power generating systems and surge suppressors, for example. Since the bandgap of SiC is large (3.03 eV for 6H-SiC), it is also well suited to high temperature and optoelectronic applications. Moreover, SiC exists in a wide variety of stable polytype forms and, therefore, has the potential for use in novel devices utilizing heterostructures of different polytypes. Advantageously, such devices would be nearly stain-free, due to the low basal plane lattice mismatch between polytypes ($\Delta a/a \approx 0.0005$ for 3C/6H). Lastly, there would also be little or no contribution to heterostructure interface energy due to chemical potential differences.

While the usefulness of SiC is well known, the present methods of fabrication generally give less than satisfactory results. For example, the current practice of growing SiC for most commercial applications involves the use of a chemical vapor deposition technique. While somewhat successful, the SiC grown by this technique is expensive and lacks sufficient quality and purity for widespread use in electronic applications.

In order to overcome these limitations, recent efforts to grow the desired high purity layers of SiC have incorporated the MBE method. MBE is well known to those skilled in the art. Generally, according to the MBE method, the constituent elements of the desired semiconductor material are placed into the MBE chamber and converted into molecular beams by one of several methods, such as direct heating, electron beam impringement, and the like. The beams thus generated are directed onto a heated substrate within a growth chamber. The desired layers of material are grown upon the substrate by flux deposition over a period of time. MBE can provide extremely high purity results when the source materials and substrate are highly purified and the process ensues in an ultra high vacuum environment. The MBE method provides a high degree of control over the growth process, and as a result is well suited for the production of high quality semiconductor materials.

Thus, while the solution to the purity problem would appear to lie in the use of MBE to grow SiC, it is known that a problem lies in the inability of SiC to be reliably grown using MBE, especially homoepitaxial SiC wherein SiC layers are grown upon a SiC substrate. One recent SiC MBE technique has demonstrated heteroepitaxial growth of 3C-SiC films on Si using $C_{60}$ and Si effusion cells, and the films exhibit a lower stacking fault density and show no evidence of twinning or mixed polytypes. This technique, while somewhat successful utilizes the sublimation mode of beam generation and, accordingly, provides less than desirable results.

Another recent SiC investigation utilizing the MBE technique, has resulted in the growth of 6H-SiC epitaxial layers on Si (111) and 6H-SiC(0001) by solid-source MBE using silicon and carbon flux generated by electron-beam sources. While somewhat successful, this technique also gives less than desirable results because the flux generated by the electron-beam is unstable and results in inconsistent material growth; not a solution to the problem of poviding high quality SiC semiconductor material, and especially homoepitaxial SiC.

A need exists therefore for a method of reliably growing homoepitaxial SiC utilizing the desirable MBE method and providing high quality, high purity SiC deposition.

SUMMARY OF THE INVENTION

Accordingly, it is a primary object of the present invention to provide a method of growing homoepitaxial SIC overcoming the limitations and disadvantages of the prior art.

Another object of the present invention is to provide a method of growing homoepitaxial SiC providing very high quality SiC layer growth.

Yet another object of the present invention is to provide a method of growing high quality homoepitaxial SiC using MBE.

Still another object of the present invention is to provide a method of growing homoepitaxial SiC using MBE with effusion cells containing solid source carbon and silicon elements.

These and other objects of the invention become apparent as the description of the representative embodiments proceeds.

In accordance with the foregoing principles and objects of the invention, a method of growing homoepitaxial SiC using MBE is described. The method of the present invention uses solid source carbon and silicon constituent elements. The carbon is preferably Buckminster Fullerene, $C_{60}$, powder, and the silicon is preferably a portion of a high purity silicon boule. While the method of the invention is described in terms of using Buckminster Fullerene, $C_{60}$, powder and high purity silicon boules, it should be appreciated that satisfactory results can be achieved using other Fullerenes and other high purity sources of silicon as well without departing from the spirit and scope of the invention.

According to the method of the present invention, the carbon powder is charged into a first crucible and the crucible is then installed into a first effusion cell. In order to use solid source silicon in the MBE system, the silicon must be heated to a molten state before material flux can occur. This gives rise to a significant problem in that molten silicon will dissolve whatever container it is in. According to an important aspect of the present invention, a second crucible is rendered suitable for containing the molten silicon by first coating it with a layer of SiC. This SiC coating prevents the molten silicon from reacting with the crucible and thus facilitates the use of the high purity silicon boule in MBE.

A SiC substrate is prepared for the SiC layer growth by polishing and cleaning. The substrate is placed in the MBE growth chamber as are the effusion cells. The MBE growth chamber is evacuated. The substrate is preferably heated to a temperature of about 1500° C. in order to provide sufficient energy to enable efficient growth thereon. The first effusion cell containing the carbon powder is preferably heated to a temperature of about 500° C. to 650° C. The second effusion cell containing the silicon is preferably heated to a temperature above about 1500° C.

Advantageously, the method of growing homoepitaxial SiC of the present invention produces quality 6H-SiC homoepitaxial growth, something not possible by the methods of the prior solid-state art.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1:
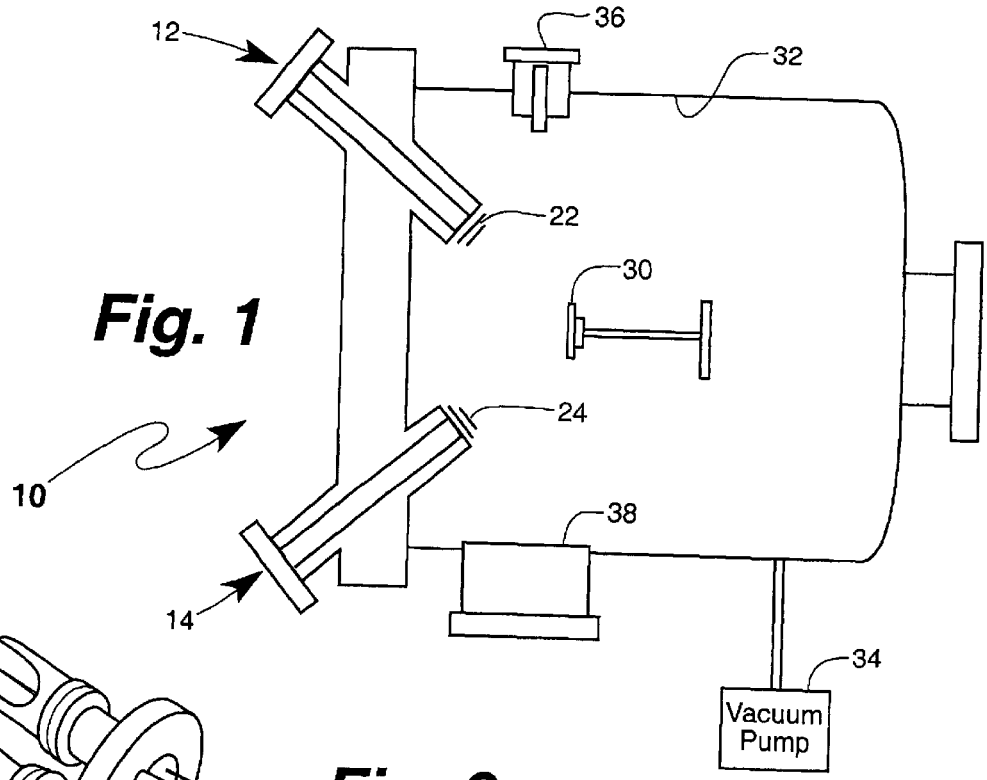
FIG. 1 is a simplified, diagrammatic view of a representative MBE growth chamber within a typical MBE system.

Reference is made to FIG. 1 showing a typical MBE growth chamber 10 suitable for performing the method of the present of the present invention. While any one of a number of commercially available MBE systems can be used in accordance with the present method, one MBE system providing satisfactory results in the Applied EPI Model 930 from Applied EPI, St. Paul, Minn., 55127. As is typical with standard MBE systems, the MBE growth chamber 10 includes a number of removable effusion cells, only two are shown in FIG. 1 for the sake of clarity and designated 12 and 14. As is known to those skilled in the art, the choice of effusion cells varies by application such as high temperature, low temperature, and the like.

Figure 2:
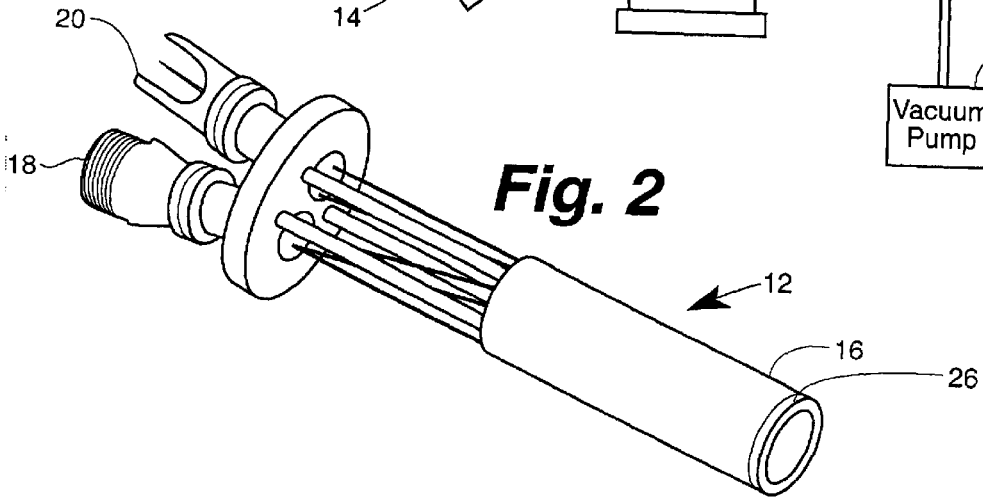
FIG. 2 is a perspective view of a representative effusion cell suitable for use in performing the method of the present invention; and, FIG. 3 is a cross sectional view of typical crucibles for use within an effusion cell.

Reference is now made to FIG. 2 showing a typical effusion cell, which for the purposes of illustration, is designated the first effusion cell 12. The effusion cell 12 includes a head assembly 16 containing a heating filament and a thermocouple, both not shown. A power connector 18 is provided to direct power to the heating filament and a thermocouple connector 20 is provided to enable remote sensing of the thermocouple. Shutters, diagrammatically illustrated as 22 and 24 are provided with such effusion cell to enable precise beam control therefrom.

Figure 3:
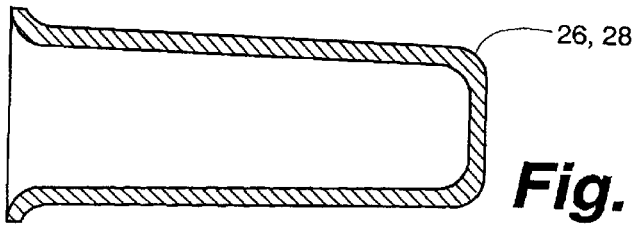

The material to be deposited by the MBE process is charged into a crucible 26 generally depicted in FIG. 3. Crucibles are fabricated from suitable high temperature materials such as titanium. They often incorporate a removable liner. A common material used in making the removable liner is graphite. Each effusion cell 12 and 14 utilizes an associated crucible 26, 28. As shown in FIG. 2 the crucible 26 is installed in the end of the effusion cell 12. The graphite liners are not shown. The crucible 28 for use with the second effusion cell 14 is installed in a similar manner.

According to the method of the present invention, the first crucible 26 is charged with a quantity of carbon powder, which in the preferred embodiment is Buckminster Fullerene, $C_{60}$, powder. The charged crucible 26 is in turn installed into the first effusion cell 22.

According to an important aspect of the present invention, the method of the present invention utilizes a portion of a high purity silicon boule as the silicon source. As is known in the art, a problem with using silicon in the MBE technique lies in the propensity of the molten silicon to react with the crucible it is contained in. Obviously, this is an unsatisfactory condition. Advantageously, according to the method of the present invention, the second crucible 28 is rendered suitable for containing molten silicon by first coating it with a layer of SiC. This coating of SiC prevents the molten silicon from reacting with the crucible and thus facilitates the use of the high purity silicon boule in MBE, providing high purity results.

The SiC coating can be applied by placing a small quantity of electronic grade silicon within the crucible and then heating the crucible until the silicon has completely evaporated. During the evaporation process, the some of the silicon reacts with the graphite crucible material to form a SiC coating. Another method would be to directly coat the crucible with SiC. A last method also providing satisfactory results is to coat the crucible directly with SiC, expose the crucible to atmosphere and then repeat the SiC coating process. This process has been observed to change the type and density of nucleation sites in the growth surface and results in smaller tighter SiC grain growth. While each of these methods provides satisfactory results, the latter method has been observed to provide finer grains of SiC and less grain boundary diffusion, both of which serve to limit unwanted reactions between the crucible and the molten silicon. The silicon boule is then charged into the coated second crucible 28 which, in turn, is installed into a second effusion cell 14.

The substrate used in performing the steps of the method of the present invention can be one of any number of SiC wafers known to those skilled in the art. A substrate providing satisfactory results with the method of the present invention is research-grade Cree 6H-SiC (0001), normally miscut 3.5° toward [11–20] available from Cree, Inc., Durham, N.C.

Because the as-received wafer surfaces are sometimes rough and contain scratches, they are preferably cleaned and polished prior to use in the method of the present invention. Various cleaning and polishing methods to those skilled in the art can be employed to provide satisfactory results. As an example, a chemical-mechanical method providing satisfactory results includes polishing the substrate with a mechanical polisher such as the R6DE-DC-4 polisher available from Strasbaugh, San Luis Obispo, Calif. The substrate is polished with a colloidal silica polishing solution available, for example, from Logitech Product Group, Westlake, Ohio, under a 2000 gm pressure at a speed of 200 rpm. The substrate is then cleaned with pressurized $CO_2$ to remove particles, etched for 10 minutes with buffered HF to remove residual oxide, rinsed in 17MΩ deionized water and then blown dry with pressurized $N_2$.

The cleaned and polished substrate 30 is loaded into the MBE growth chamber 32. Preferably, the substrate 30 is loaded into the growth chamber within 5 minutes of completion of the cleaning and polishing. In preparation for the material deposition process, the MBE growth chamber 32 is then evacuated by a vacuum pump 34 to a high-vacuum (base pressure in the low $10^{-10}$ torr range).

As is known in the art, MBE growth systems often include a system for in-situ growth monitoring. One well known system providing satisfactory results is the Reflection High-Energy Electron Diffraction or RHEED system. Reference is made to FIG. 1 showing a representative RHEED gun 37 for the emmission of electrons and a phosphor screen 38 for imaging the received electron patterns. In use, electrons reflect from the surface of the substrate forming a pattern of specular reflection and diffraction patterns indicative of the surface crystallography of the substrate. In this way, the SiC growth within the MBE growth chamber 32 can be precisely monitored.

After the substrate 30 is loaded into the MBE growth chamber 32 and the chamber evacuated, the substrate 30 is heated in order to provide sufficient energy to enable efficient growth thereon. The substrate 30 is preferably heated to a temperature of about 1500° C. The first effusion cell 12 is preferably heated to a temperature of about 500° C. to 650° C. The second effusion cell containing the silicon is preferably heated to a temperature above about 1500° C. The effusion cells are operated in the evaporation mode, providing enhanced layer growth and purity. The deposition of material is regulated by controllably actuating the shutters 22 and 24.

Advantageously, the method of growing homoepitaxial SiC of the present invention produces high quality 6H-SiC homoepitaxial growth, something not possible by the methods of the prior art. For example, high quality 6H-SiC films have been grown with $T_G$=1500° C., Si Beam Equivalent Pressure (BEP) values between $1.5\times10^{-8}$ and $2.0\times10^{-8}$, Si:$C_{60}$ BEP ratios between 1.5 and 2.25, and growth rates around 30 nm/hr.

In summary, numerous benefits have been described from utilizing the principles of the present invention. The method of the present invention provides for high quality homoepitaxial SiC growth by facilitating the use of solid source materials within MBE growth systems.

The foregoing description of the preferred embodiment has been presented for purposes of illustration and description and description. It is not intended to be exhaustive or to limit the invention of the precise form disclosed. Obvious modifications or variations are possible in light of the above teachings. For example, the present invention is not considered limited to the temperatures recited in the examples given herein. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

We claim:

1. A solid source method of growing a homoepitaxial SiC film within an MBE system having a growth chamber and effusion cells having shutters, comprising the steps of:

charging a first crucible with a quantity of Fullerenes;

installing said first crucible into a first effusion cell;

placing said first effusion cell into the growth chamber;

coating a second crucible with a layer of SiC;

charging said second crucible with a quantity of solid Si;

installing said second crucible into a second effusion cell;

placing said second effusion cell into the growth chamber;

providing a 6H-SiC substrate;

preparing said substrate by chemical-mechanical polishing;

loading said substrate into the growth chamber;

evacuating the growth chamber;

heating said substrate to a temperature of about 1500° C.;

heating said first effusion cell to a temperature range of about 500° C. to 650° C.;

heating said second effusion cell to a temperature above about 1500° C.; and, growing a 6H-SiC homoepitaxial layer upon said substrate by controllably actuating the effusion cell shutters.

2. A solid source method of growing a homoepitaxial SiC film within an MBE system having a growth chamber and effusion cells having shutters, comprising the steps of:

charging a first crucible with a quantity of Fullerenes;

installing said first crucible into a first effusion cell;

placing said first effusion cell into the growth chamber;

coating a second crucible with a layer of SiC;

exposing said coated crucible to atmosphere;

repeating said coating step above;

charging said second crucible with a quantity of solid Si;

installing said second crucible into a second effusion cell;

placing said second effusion cell into the growth chamber;

providing a SiC substrate;

polishing said substrate;

cleaning said substrate with pressurized $CO_2$;

etching said substrate;

rinsing said substrate;

drying said substrate with pressurized $N_2$;

loading said substrate into the growth chamber;

evacuating the growth chamber;

heating said substrate to a temperature of about 1500° C.;

heating said first effusion cell to a temperature range of about 500° C. to 650° C.;

heating said second effusion cell to a temperature above about 1500° C.; and, growing a homoepitaxial layer of SiC upon said substrate by controllably actuating the effusion cell shutters.

* * * * *